(12) United States Patent
Kirikoshi et al.

(10) Patent No.: US 7,291,931 B2
(45) Date of Patent: Nov. 6, 2007

(54) SEMICONDUCTOR DEVICE, SEMICONDUCTOR SUBSTRATE AND FABRICATION PROCESS OF A SEMICONDUCTOR DEVICE

(75) Inventors: Katsuyoshi Kirikoshi, Kawasaki (JP); Eiichi Kawamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/350,840

(22) Filed: Feb. 10, 2006

(65) Prior Publication Data

US 2006/0125101 A1 Jun. 15, 2006

Related U.S. Application Data

(62) Division of application No. 11/001,313, filed on Dec. 2, 2004, now Pat. No. 7,033,904.

(30) Foreign Application Priority Data

Aug. 4, 2004 (JP) ............................. 2004-228345

(51) Int. Cl.
*H01L 23/544* (2006.01)
(52) U.S. Cl. ............... 257/798; 257/776; 257/E23.143; 438/14; 438/401
(58) Field of Classification Search ................ 257/797, 257/776, E23.143
See application file for complete search history.

(56) References Cited

U.S. PATENT DOCUMENTS 6,617,669 B2 9/2003 Saito ........................ 257/622

6,841,451 B2 1/2005 Okayama et al.

FOREIGN PATENT DOCUMENTS

| JP | 6-29183 | 2/1994 |
|---|---|---|
| JP | 2000-60702 | 9/2000 |
| JP | 2000-260702 | 9/2000 |
| JP | 2002-89507 | 10/2002 |
| JP | 2002-289507 | 10/2002 |

OTHER PUBLICATIONS

Stanley Wolf, Silicon Processing for the VLSI Era vol. 2: Process Integration, 1990 by LAttice PRess, pp. 189-194.

*Primary Examiner*—George R. Fourson
*Assistant Examiner*—Julio J. Maldonado
(74) *Attorney, Agent, or Firm*—Westerman, Hattori, Daniels & Adrian, LLP.

(57) ABSTRACT

A semiconductor device includes a first insulation layer including a first conductor pattern, a second insulation layer formed on the first insulation layer and including a second conductor pattern, and a third conductor pattern formed on the second insulation layer, wherein there is formed a first alignment mark part in the first insulation layer by a part of the first conductor pattern, the third conductor pattern is formed with a second alignment mark part corresponding to the first alignment mark part, the first and second alignment marks forming a mark pair for detecting alignment of the first conductor pattern and the third conductor pattern, the second conductor pattern being formed in the second insulation layer so as to avoid the first alignment mark part.

7 Claims, 11 Drawing Sheets

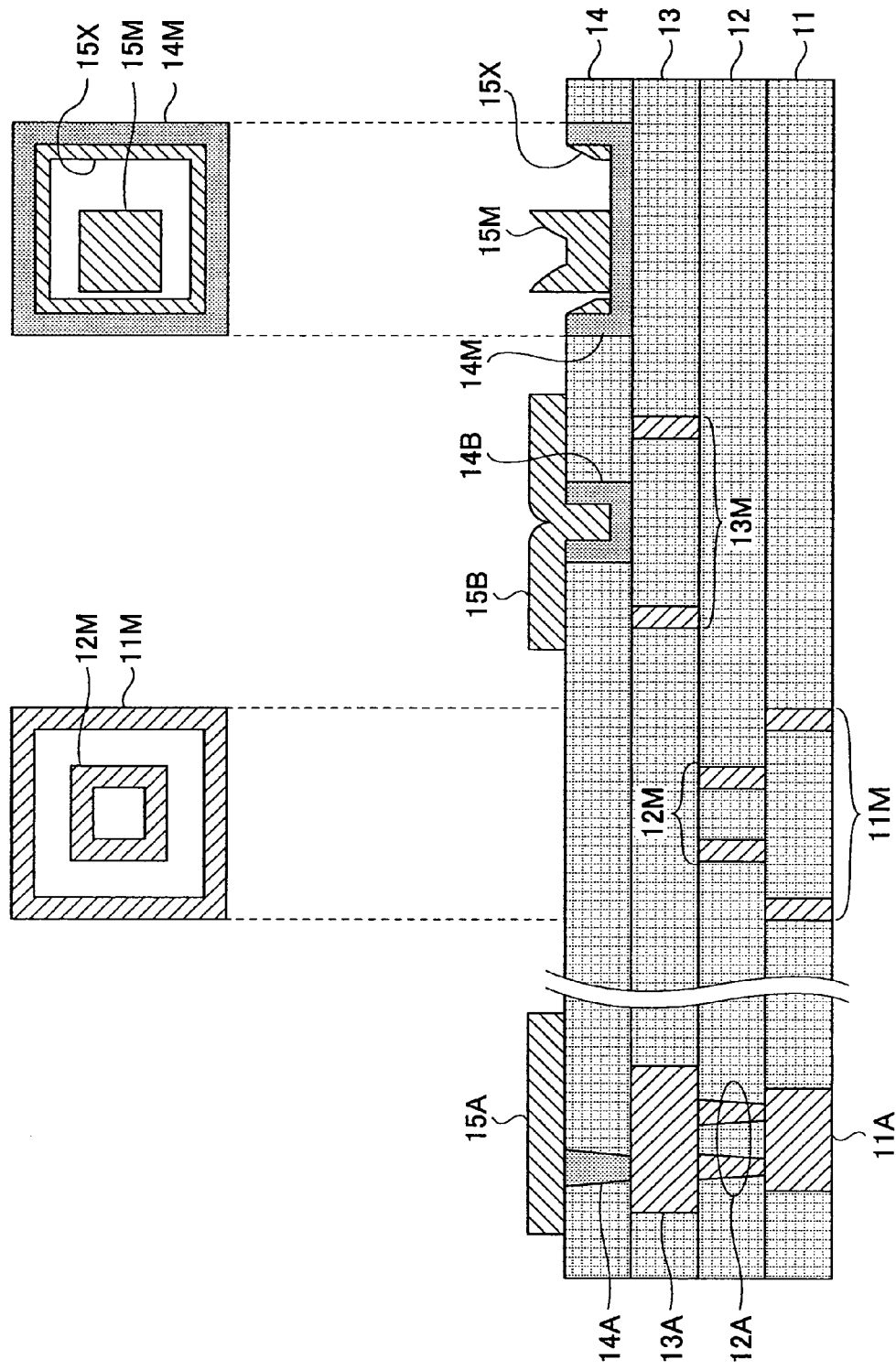

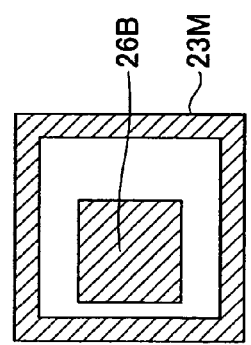
FIG.4F
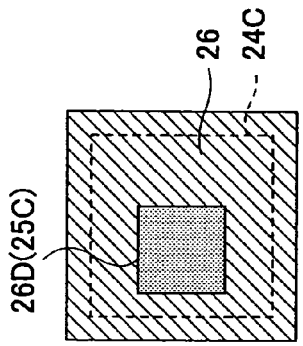
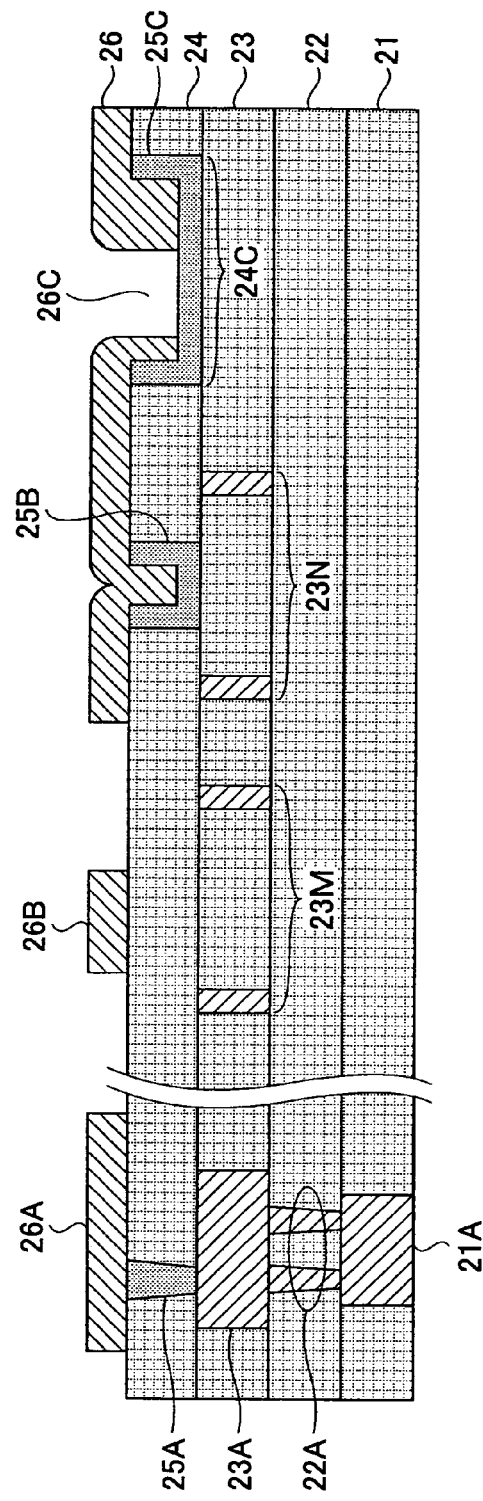
FIG.4G

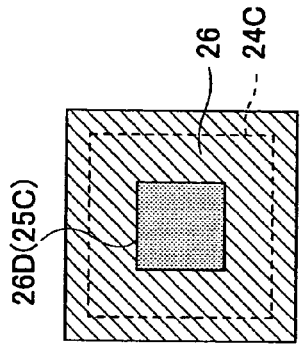
FIG.5A
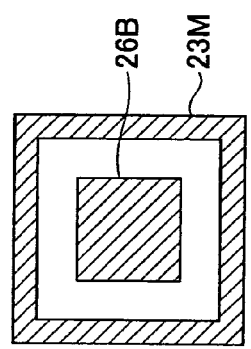
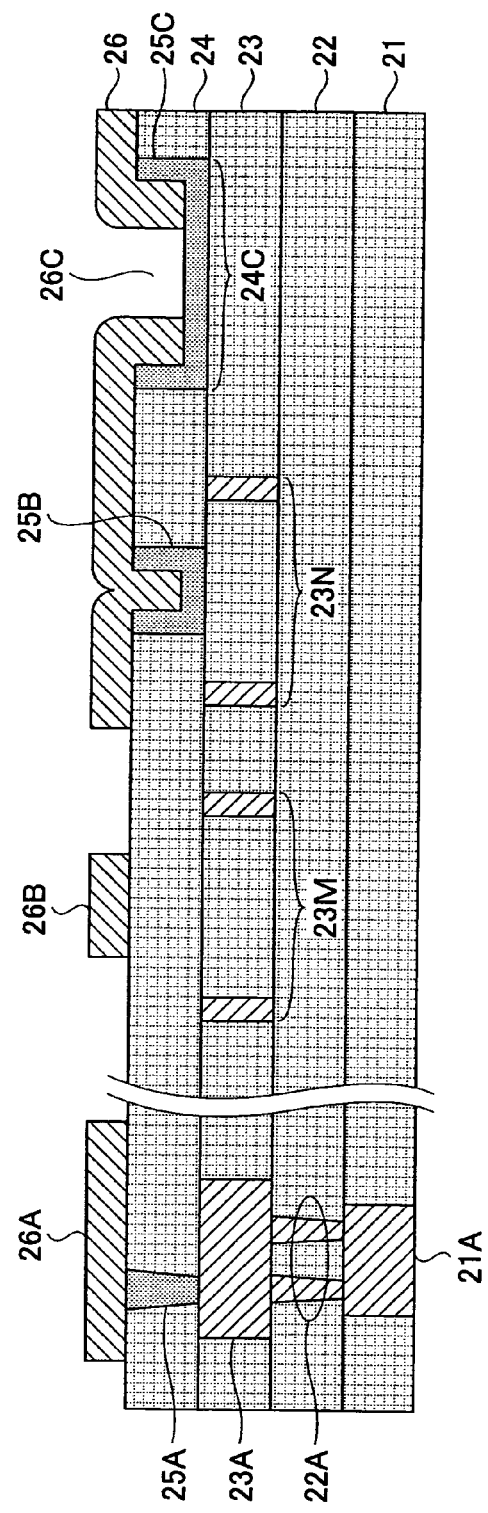
FIG.5B

7,291,931 B2

SEMICONDUCTOR DEVICE, SEMICONDUCTOR SUBSTRATE AND FABRICATION PROCESS OF A SEMICONDUCTOR DEVICE

CROSS-REFERENCE TO RELATED APPLICATION

The present application is a Divisional of application Ser. No. 11/001,313, filed Dec. 2, 2004 now U.S. Pat. No. 7,033,904, which is based on Japanese priority application No. 2004-228345 filed on Aug. 4, 2004, the entire contents of which are hereby incorporated by reference.

BACKGROUND OF THE INVENTION

The present invention generally relates to fabrication of semiconductor devices and more specifically to the alignment technology of a stepper.

With the demand of higher operational speed and versatile function for semiconductor devices, patterns formed on a surface of a semiconductor wafer such as a silicon wafer have now become extremely miniaturized. Associated with this, it is now required an extremely high-precision alignment in the photolithographic process, particularly the exposure process of semiconductor substrate conducted by using steppers.

Generally, a semiconductor device includes a semiconductor substrate carrying active elements such as a transistor and plural interconnection layers formed on such a semiconductor substrate, wherein each interconnection layer is formed of an interlayer insulation film and an interconnection pattern embedded in the interlayer insulation film.

In the fabrication process of a such a semiconductor device, alignment marks are used for achieving positional alignment between the upper and lower interconnection layers.

(Patent Reference 1) Japanese Laid Open Patent Application 2000-260702 official gazette (Patent Reference 2) Japanese Laid Open Patent Application 2002-289507 official gazette (Patent Reference 3) Japanese Laid-Open Patent Application 6-29183 official gazette

SUMMARY OF THE INVENTION

FIGS. 1A and 1B are respectively the plan view and the cross-sectional view showing an example of positional alignment used in the fabrication process of a semiconductor device having a multilayer interconnection structure by using an alignment mark.

Referring to the cross-sectional view of FIG. 1B at first, the multilayer interconnection structure is formed of lamination of interlayer insulation films 11-14 in the illustrated example, wherein the interlayer insulation film 11 is formed with a Cu interconnection pattern 11A, the interlayer insulation film 12 is formed with a contact plug 12A of Cu, the interlayer insulation film 13 is formed with a Cu interconnection pattern 13A, and the interlayer insulation film 14 is formed with a W contact plug 14A. In the state of FIGS. 1A and 1B, an Al layer formed on the interlayer insulation film 14 is about to be patterned while using a resist pattern R1 as a mask.

Thereby, an alignment mark pattern 11M and an alignment mark pattern 12M are formed respectively in the interlayer insulation film 11 and the interlayer insulation film 12 simultaneously to the Cu interconnection pattern 11A and the Cu plug 12A, wherein the Cu interconnection pattern 11A and the Cu plug 12A are aligned by using the positional alignment mark pattern 11M. Similarly, the Cu plug 12A and the Cu interconnection pattern 13A are aligned by using the alignment mark 12M. Further, the W plug 14A is aligned to the Cu interconnection pattern 13A by using the alignment mark 13M.

In the case of forming the interconnection pattern 11A or 13A or the Cu plug 12A or the W plug 14A, a resist pattern is formed on the optically transparent interlayer insulation films 11-14 as an etching mask, wherein the positional alignment of the resist pattern can be confirmed, and corrected if necessary, by using the alignment mark formed in the interlayer insulation film underlying the interlayer insulation film that is going to be patterned.

Thus, it will be noted that the structure of FIG. 1B is formed by aligning the pattern of the next layer to the pattern of the layer immediately before, or alternatively by aligning to a specific layer in which the requirement of the positional alignment is particularly stringent. On the other hand, in relation to the fabrication of recent semiconductor devices having ultrafine patterns, there is proposed a technology of achieving positional alignment to plural layers in which there is imposed a stringent demand for the precision of the positional alignment.

Meanwhile, in the step of FIG. 1B, it should be noted that a film 15 of Al or Al alloy (referred to hereinafter as Al film) deposited on the uppermost interlayer insulation film 14 is to be patterned by using the resist pattern R1 as a mask. Thereby, because of existence of the Al film 15, it is not possible to recognize the alignment mark pattern formed in the interlayer insulation film 14 or 13 by way of optical means.

Because of this, there is formed a depression in the example of FIG. 1B in the interlayer insulation film 14 as an alignment mark 14M, simultaneously to the contact hole for the contact plug 14A, and positional alignment between the resist pattern R1 and the alignment mark 14M is achieved by observing the depression formed on the surface of the Al film 15 in correspondence to the alignment mark 14M.

On the other hand, the Al film 15 is generally formed by a sputtering process, and because of this, filling of the depression 14M with the Al film 15 can become asymmetric as shown in the illustrated example, depending on the positional relationship thereof with regard to the sputtering target. In such a case, the resist pattern R1 formed at the central part of the detected depression can be deviated significantly with regard to the alignment mark 14M as indicated in FIG. 1A.

In such a case, the Al interconnection pattern formed by using the resist pattern R1 is inevitably deviated with respect to the W plug 14A.

In order to solve this problem, Japanese Laid-Open Patent Application 2002-289507 proposes a technology that exposes the depression of the mark pattern 14M by applying a patterning process to the Al film 15 by using the resist pattern R1 as a mask. By measuring such a depression 14M and an Al pattern 15M formed in the depression 14M as a result of the patterning of the Al film 15, it becomes possible to avoid erroneous alignment that would be caused under the situation of FIG. 1A. In FIGS. 2A and 2B, it should be noted that those parts corresponding to the parts described previously are designated by the same reference numerals and the description thereof will be omitted.

In the case the Al film 15 is patterned at the depression 14M, there tends to remain a residue 15X of the Al film 15 along the inner wall surface of the depression 14M. Thus, in the case such an alignment mark pattern is scanned in FIG. 3A in the A-A' direction, the result of such a scan conducted along the pattern edge generally includes a large amount of noise as shown in FIG. 3B, and it becomes difficult to achieve precise alignment. Further, such Al film residue 15X remaining at the sidewall surface of the alignment mark 15M can fall off upon the processing conducted after the patterning process such as a wet cleaning process, while there is a risk that such fragment of conductor causes short circuit of the interconnection patterns.

In the structure of FIG. 2B, in which the Al film 15 is patterned, it will be noted that the mark pattern 11M formed in the interlayer insulation film 11 and the mark pattern 12M formed in the interlayer insulation film 12 are visually recognizable through the interlayer insulation films 13 and 14 as represented in FIG. 2A. However, with such a conventional process, there is formed no alignment mark pattern in the Al pattern formed by patterning of the Al film 15 comparable with the mark pattern 11M or 12M, and because of this, it is difficult to achieve high-precision alignment of such an Al pattern with respect to the alignment mark pattern 11M or 12M.

In a first aspect of the present invention, there is provided a semiconductor device, comprising:

a first insulation layer including a first conductor pattern;

a second insulation layer formed on the first insulation layer and including a second conductor pattern; and a third conductor pattern formed on the second insulation layer, wherein there is formed a first alignment mark part in said first insulation layer by a part of said first conductor pattern, said third conductor pattern is formed with a second alignment mark part corresponding to the first alignment mark part, said first and second alignment marks forming a mark pair for detecting alignment of said first conductor pattern and said third conductor pattern, said second conductor pattern being formed in said second insulation layer so as to avoid said first alignment mark part.

In another aspect, the present invention provides a semiconductor substrate, in which a large number of semiconductor devices are formed in regions defined by a scribe region, each of said semiconductor devices comprising:

a first insulation layer including a first conductor pattern;

a second insulation layer formed on said first insulation layer and including a second conductor pattern; and a third conductor pattern formed on said second insulation layer, said first conductor pattern forming a first alignment mark part on said scribe region, said third conductor pattern forming a second alignment mark part with regard to said first alignment mark part on said scribe region, said first and second alignment mark parts forming an alignment mark pair on said scribe region, said second conductor pattern being formed so as to avoid said first alignment mark part.

In another aspect, the present invention provides a fabrication process of a semiconductor device, comprising the step of forming, on a layered structure of a first insulation film including a first conductor pattern and a second insulation film formed on said first insulation film and including a second conductor pattern, a third conductor pattern, said method comprising the steps of:

measuring a first alignment error between said first conductor pattern and said second conductor pattern;

measuring a second alignment error between said second conductor pattern and said third conductor pattern, patterning said third conductor pattern on said insulation film by an etching process, measuring a third alignment error between said third conductor pattern and said first conductor pattern by monitoring said third conductor pattern and an alignment mark included in said first insulation film; and obtaining a corrected alignment error in which said second alignment error is corrected based on said first and third alignment errors.

According to the present invention, it becomes possible to directly align the third conductor pattern with respect to the first conductor pattern through the second insulation film. With this, it becomes possible to correct erroneous positional alignment, which tends to appear at the time of aligning the second conductor pattern and the third conductor pattern. Further, because the alignment between the second conductor pattern and the third conductor pattern is achieved by the measurement of the positional relationship between the depression formed in the third conductor pattern in correspondence to the first alignment opening formed in the second insulation film and the second alignment opening formed in the third conductor pattern so as to be included in the first alignment opening, there occurs no exposure of the sidewall surface of the first alignment opening, and thus, the problems such as poor alignment detection caused by conductive residue formed at such a sidewall surface or short circuit caused by such a conductive residue falling off at the time of subsequent cleaning process, is effectively avoided.

Other objects and further features of the present invention will become apparent from the following detailed description when read in conjunction with the attached drawings.

BRIEF DESCRIPTION OF THE DRAWINGS

FIGS. 2A and 2B are diagrams showing the patterning method according to other related art of the present invention;

FIGS. 4A-4G are diagrams showing the fabrication process of a semiconductor device according to an embodiment of the present invention;

FIGS. 5A and 5B are diagrams showing an example of the semiconductor device according to an embodiment of the present invention;

DETAILED DESCRIPTION OF THE INVENTION

Hereinafter, the present invention will be explained with reference to FIGS. 4A-4G.

Figures 1A, 1B:
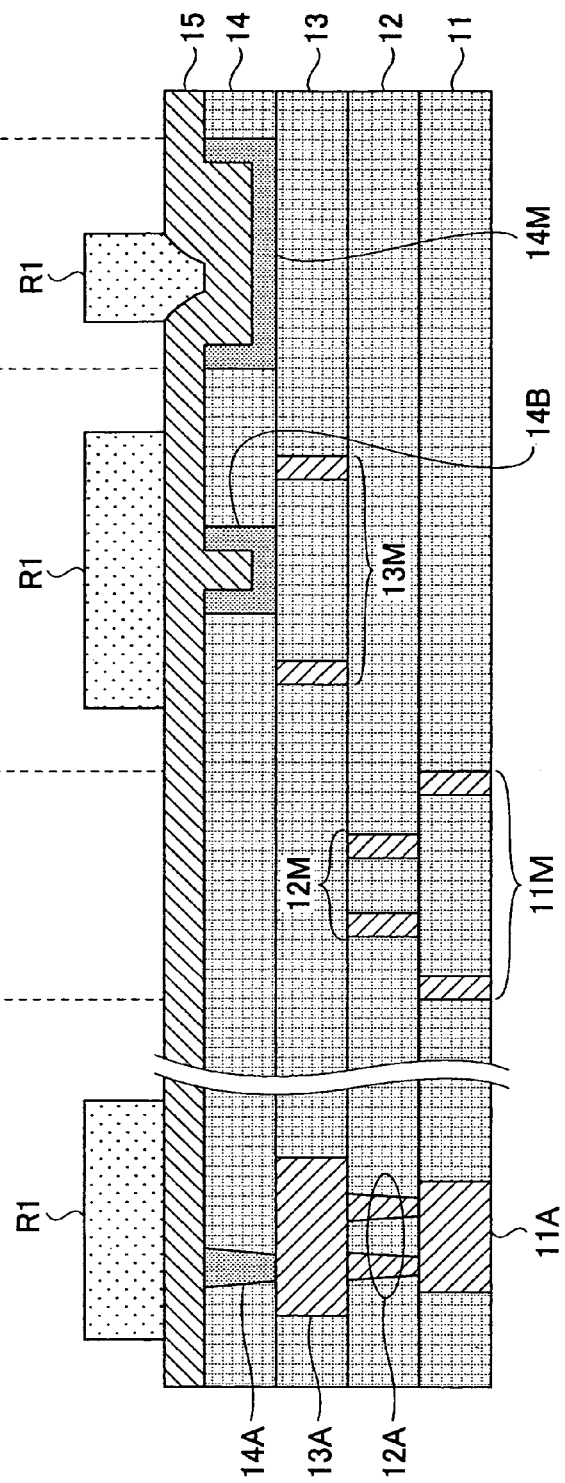
FIGS. 1A and 1B are diagrams showing the patterning method according to a related art of the present invention.
Figure 3A:
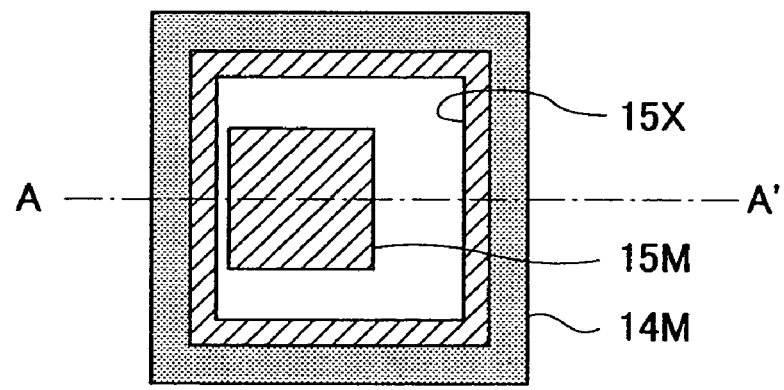
FIGS. 3A and 3B are diagrams explaining the problems associated with the technology of FIGS. 2A and 2B.
Figure 3B:
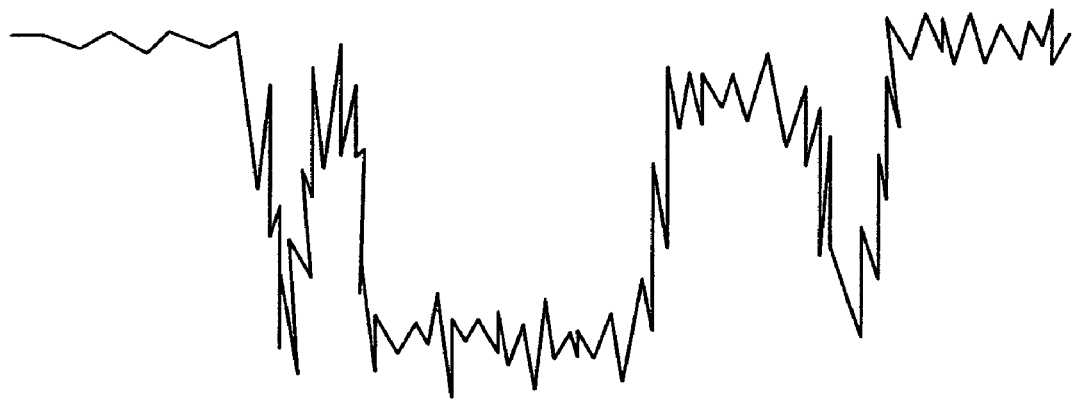
Figure 4A:
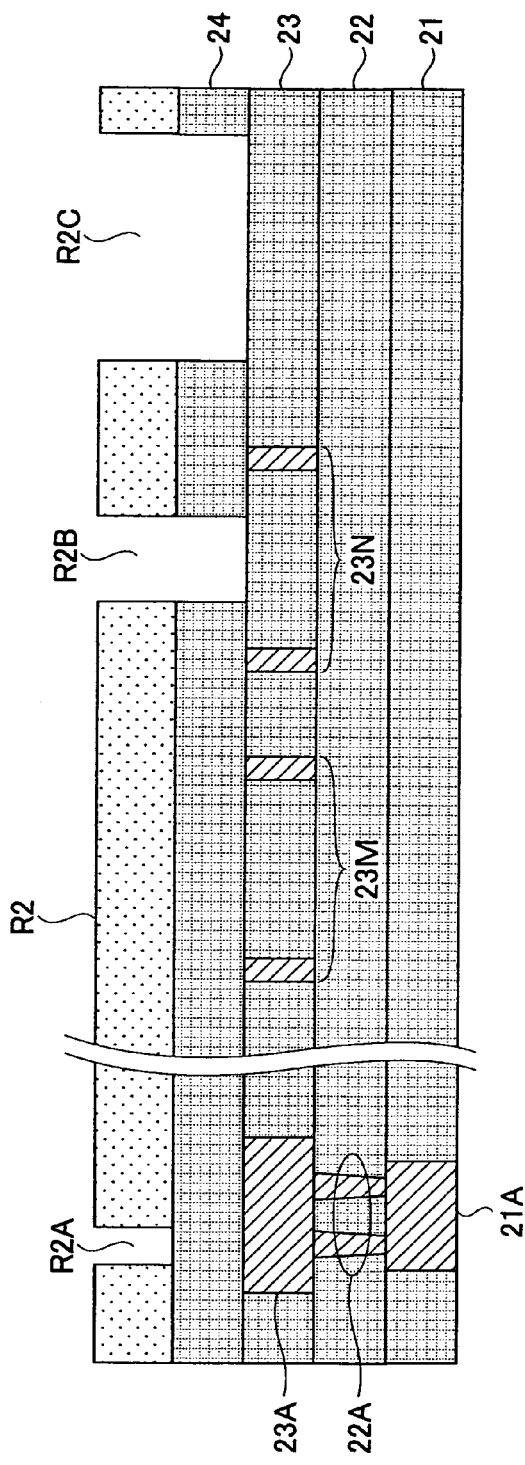

Referring to FIG. 4A, there are formed an interlayer insulation film 21 including therein a Cu interconnection pattern 21A and an interlayer insulation film 22 including therein a via-plug 22A consecutively on a silicon surface not illustrated, and an interlayer insulation film 23 including therein a Cu interconnection pattern 23A is formed further on the interlayer insulation film 22. Further, the interlayer insulation film 22 is formed with a first positional alignment mark pattern 23M and a second positional alignment mark pattern 23N with a predetermined relationship with respect the interconnection pattern 23A.

Further, an interlayer insulation film 24 is formed on the interlayer insulation film 23 with a thickness of 900 nm, for example, wherein there is formed a resist pattern R2 including resist openings R2A, R2B and R2C on the interlayer insulation film 24 in the state of FIG. 4A. Thereby, it should be noted that the resist opening R2A is formed in correspondence to the Cu interconnection pattern 23A, while the resist opening R2B is formed in correspondence to the alignment mark pattern 23N.

Figure 4B:
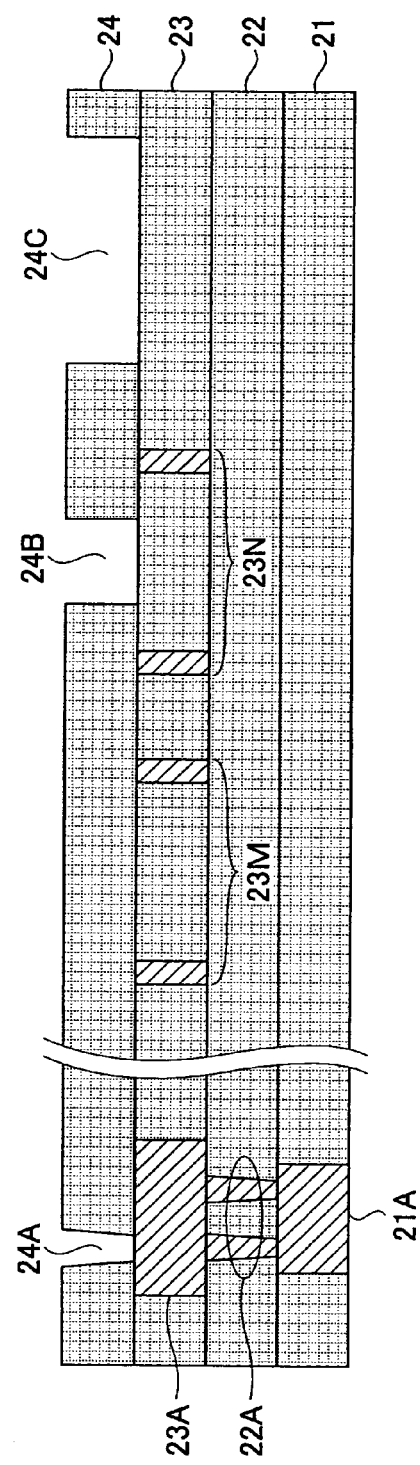

Next, in the step of FIG. 4B, positional alignment between the resist opening R2B and the second alignment mark pattern 23N is confirmed through the resist pattern R2 and the interlayer insulation film 24. In the case the alignment is confirmed, the interlayer insulation film 24 is patterned while using the resist pattern R2 as a mask, and a via-hole 24A is formed in correspondence to the Cu interconnection pattern 23A, such that the Cu interconnection pattern 23A is exposed.

Further, there is formed an opening 24B in the interlayer insulate film 24 in correspondence to the resist opening R2B, wherein there is simultaneously formed a next alignment opening 24C in correspondence to the resist opening R2C with a predetermined relationship with respect to the opening 24B.

In the case necessary positional alignment is not confirmed in the step of FIG. 4A between the resist opening R2B and the alignment mark pattern 23N, the resist pattern R2 is removed and a new resist pattern R2 is formed such that the observed error is corrected.

Figure 4C:
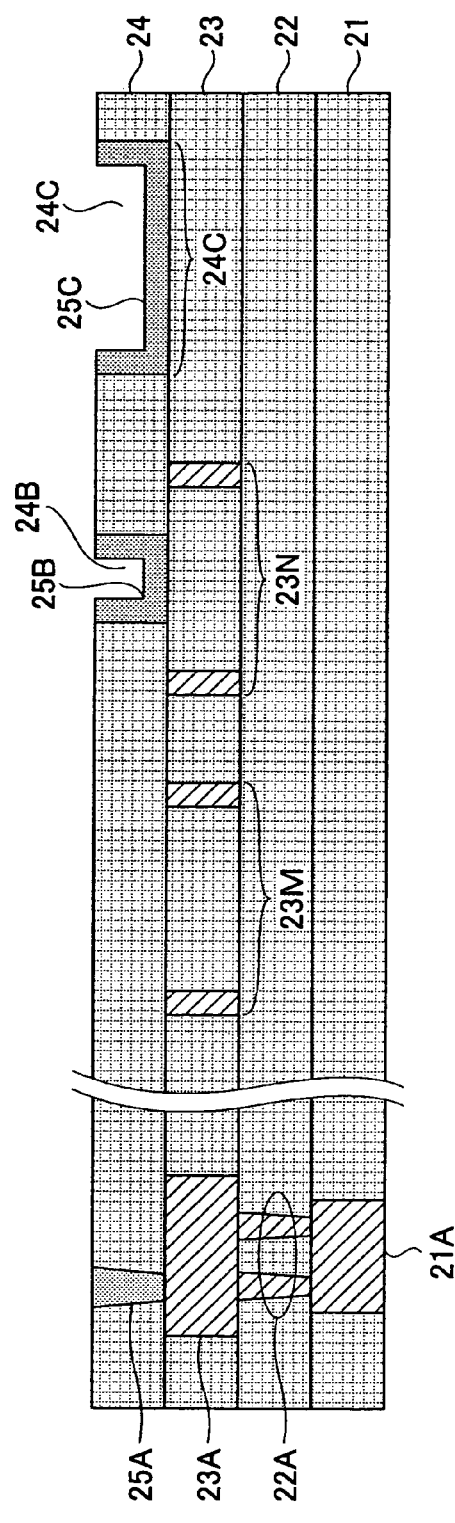

Next, in the step of FIG. 4C, a W contact plug 24A is formed in the via-hole 24A by a damascene process in which a W film is deposited uniformly on the structure of FIG. 4B so as to fill the via-hole 24A, followed by removing the excessive W film by a CMP process. At the same time, the sidewall surfaces and the bottom surfaces of the openings 24B and 24C are covered with the W films 25B and 25C, respectively. Because the openings 24B and 24C are large, they are not filled with the W film, contrary to the via hole 24A.

Figures 4D, 4E:
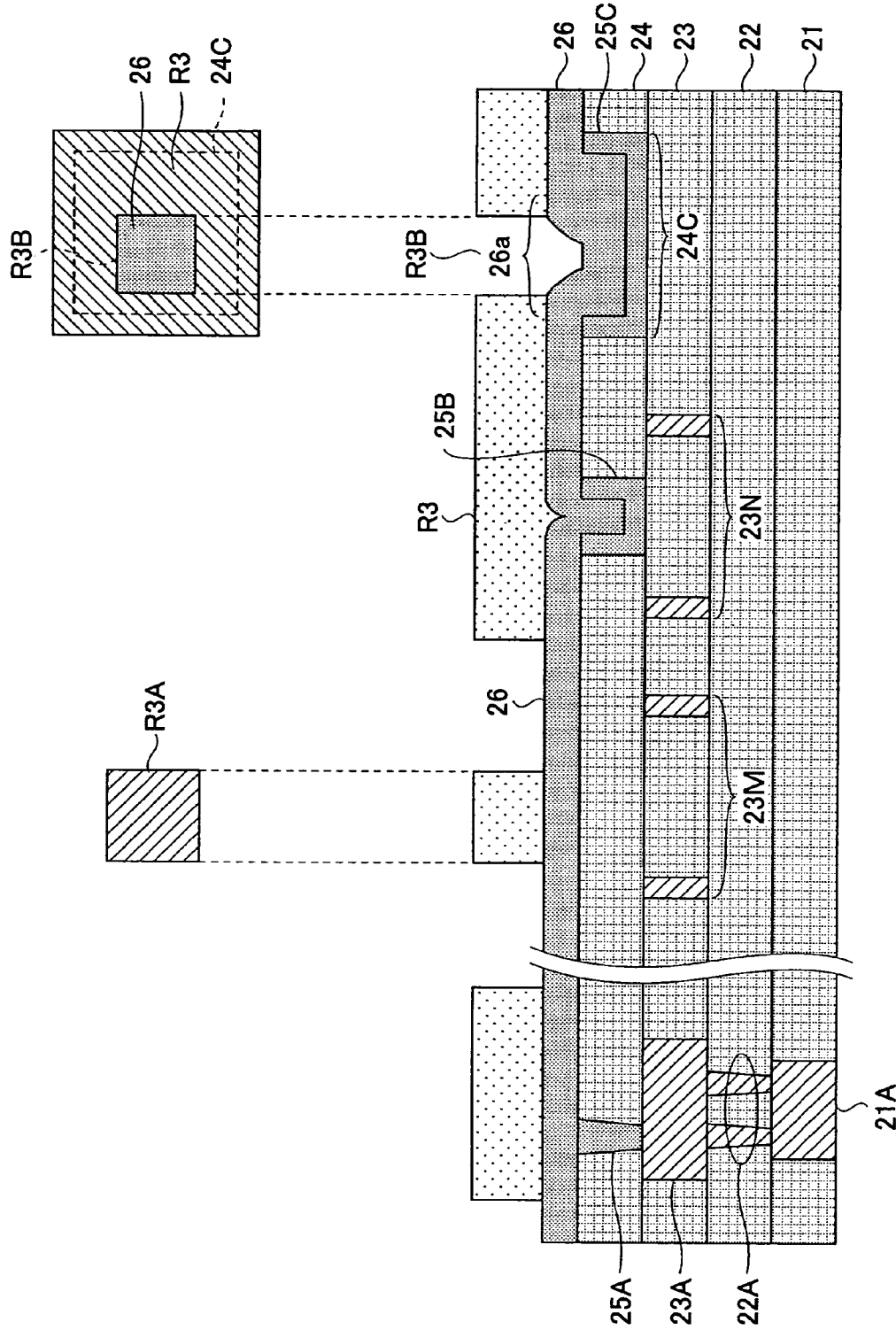

Next, in the step of FIGS. 4D and 4E, an Al film 26 is deposited on the structure of FIG. 4C by a sputtering process with the thickness of 4000 nm, for example.

While such an Al film fills the foregoing openings 24B and 24C via the W film 25B or 25C, there appears a depression at the surface of the Al film 26 in correspondence to the openings 24B and 24C because of the fact that the Al film 26 has a film thickness comparable with the depth of the openings 24B and 24C and because of the relatively large size of the openings 24B and 24C. Thereby, there is a tendency that the filling of the Al film 26 tends to become asymmetric due to the nature of the sputtering process, particularly in the opening 24C having a large size. In the illustrated example, it can be seen that the depression 26a formed in correspondence to the opening 24C is formed with offset in the left direction.

Meanwhile, in the step of FIGS. 4D and 4E, there is formed a resist pattern R3 on the Al film 26 as the patterning mask for patterning the Al film 26. Thereby, it should be noted that the resist pattern R3 is formed with a predetermined positional relation ship with regard to a pattern in the interlayer insulation film 24 such as the via plug 25A or 25B by using the depression 26a as the alignment reference.

FIG. 4D shows the resist pattern R3 of FIG. 4E in a plan view, wherein it will be noted that the resist opening R3B is formed at the central part of the depression 26a in the example of FIGS. 4D and 4E.

Here, it should be noted that the resist pattern R3 includes a resist opening R3B corresponding to the depression 26a but having a size smaller than the alignment opening 24C formed in the interlayer insulation film 24 and an isolation pattern R3A formed with a predetermined positional relationship with respect to the resist opening R3B so as to correspond to the alignment mark pattern 23M.

In the state of FIGS. 4D and 4E, however, it should be noted that the opaque Al film 26 covering the interlayer insulation film 24 extends continuously under the resist pattern R3A, and it is not possible to confirm the positional alignment between the resist pattern R3A and the alignment mark pattern 23M.

Thus, in the step of FIGS. 4F and 4G, the Al film 26 is patterned by a dry etching process, or the like, while using the resist pattern R3 as a mask, and there is formed an Al interconnection pattern 26A on the interlayer insulation film 24 so as to make a contact with the W plug 25A.

Thereby, it should be noted that there is formed an isolated Al pattern 26B in correspondence to the isolated resist pattern R3A, and an opening 26C is formed in the Al film 26 in correspondence to the resist opening R3B. Here, it should be noted that the opening 26C has a size substantially smaller than the alignment opening 24C provided underneath, and because of this, the W film 25C covering the sidewall surface of the alignment opening 24C is covered continuously with the Al film 26 that covers the surface of the interlayer insulation film 24.

Thus, with such a construction, there remains no unstable W residue at the sidewall surface of the opening 24C contrary to the example explained with reference to FIGS. 2A and 2B, and thus, there arises no problem of short circuit caused by falling off of such a residual sidewall film with the subsequent cleaning process, or the like.

Thus, with the structure of FIGS. 4F and 4G, the W film 26 covering the sidewall surface of the alignment opening 24C forms a part of the W film 26 covering the surface of the interlayer insulation film 24, and thus, such a W film is not easily falls off even when a cleaning process is applied thereafter.

Thus, with the present embodiment, it becomes possible to align the isolated Al pattern 26B, formed as a result of the patterning of the Al film 26 by using the resist pattern R3 as a mask, with regard to the alignment mark 23M in the interlayer insulation film 23 through the interlayer insulation film 24 as shown in FIG. 4F. In order to achieve this, the conductor pattern in the interlayer insulation film 24 is formed so as to avoid the alignment mark pattern 23M for enabling observation of the alignment mark pattern 23M through the interlayer insulation film 24.

Thus, with the present embodiment, it becomes possible to correct the alignment of the Al pattern 26 with regard to the conductor pattern 25A in the interlayer insulation film 24 based on the result of positional alignment between the Al pattern 26B and the alignment mark pattern 23M.

As described before, the positional alignment of the Al pattern 26A with regard to the conductor pattern 25A in the interlayer insulation film 24 is achieved based on the depression 26a on the Al film 26, and thus, there is a possibility that the alignment includes an error caused by asymmetric filling of the alignment opening 24C with the Al film 26, which is deposited by a sputtering process.

With the present invention, such correction of the alignment can be achieved according to the following equation:

$$OL(target) = OL(1\text{-}3) - OL(1\text{-}2) - OL(2\text{-}3) \qquad (1)$$

Here, it should be noted that OL(target) represents the correction value of the alignment error at the time of exposure of the resist pattern R3, OL(1-2) represents the alignment error with regard to the alignment pattern 23N at the time of exposure of the resist pattern R2, while OL(2-3) represents the alignment error at the time of exposure of the resist pattern R3, wherein these parameters are obtained for a pilot wafer processed in advance to the processing of the product wafers.

For example, the parameter OL(1-2) is obtained by obtaining the positional relationship between the opening R2B and the alignment mark pattern 23N in the step of FIG. 4A, while the parameter OL(2-3) is obtained by obtaining the positional relationship between the opening R3B and the depression 26a in the step of FIGS. 4D and 4E. Further, the parameter OL(1-3) is obtained by obtaining the positional relationship between the isolated Al pattern 26B and the alignment mark pattern 23M in the step of FIGS. 4F and 4G.

Once the parameter OL(target) is obtained, it becomes possible to properly align the resist pattern R3, and hence the Al patterns 26A and 26B, with respect to the alignment mark pattern 23M in the interlayer insulation film 23, and hence the pattern 23A, by correcting the alignment error of the resist pattern R3 in the processing of the product wafers, by adding the effect of the parameter OL(target) to the effects of the parameters OL(1-2) and OL(2-3).

$$OL(2\text{-}3)^* = OL(2\text{-}3) + OL(target) = OL(1\text{-}3) - OL(1\text{-}2) \qquad (2)$$

Table 1 below represents an example of obtaining the foregoing parameters OL(1-2), OL(2-3), OL(1-3) and OL(target) for each of the parameters wafer offset Ox, Oy, wafer scaling WSx, WSy, wafer rotation WRx, WRy, chip magnification CMx, CMy, and chip rotation CRx, CRy.

TABLE 1

|  | OL(1-2) | OL(2-3) | OL(1-3) | OL(target) |
|---|---|---|---|---|
| Ox | −0.002 | −0.008 | −0.001 | 0.009 |
| Oy | 0.006 | −0.003 | −0.005 | −0.008 |
| WSx | 0.030 | 0.093 | −0.784 | −0.907 |
| WSy | −0.055 | 0.024 | −0.832 | −0.801 |
| WRx | −0.034 | −0.052 | 0.718 | 0.804 |
| WRy | 0.048 | −0.300 | 0.524 | 0.776 |
| CMx | −0.561 | 0.354 | −1.466 | −1.259 |
| CMy | 1.846 | −0.390 | 0.442 | −1.014 |
| CRx | 0.074 | −0.003 | 0.764 | 0.693 |
| CRy | −0.964 | −0.009 | 0.722 | 1.695 |

Referring to Table 1, it will be noted that, although there are some small values, there also appear very large values for the alignment error correction value OL(target) in those parameters such as wafer scaling WSx, WSy, wafer rotation WRx, WRy, and chip magnification CMx, CMy, in which the alignment error OL(2-3) with regard to he under layer 24 has been small at the time of patterning of the Al layer 26.

Thus, when the foregoing alignment error correction OL(target) has been obtained for the pilot wafer by using the foregoing Equation (1), it becomes possible to correct the alignment error of the Al pattern 26A according to Equation (2) by using the alignment error correction value OL(target). Thereby, the pattern 26B is properly aligned with regard to the alignment mark pattern 23M in the product wafer as shown in FIGS. 5A and 5B.

Figure 6:
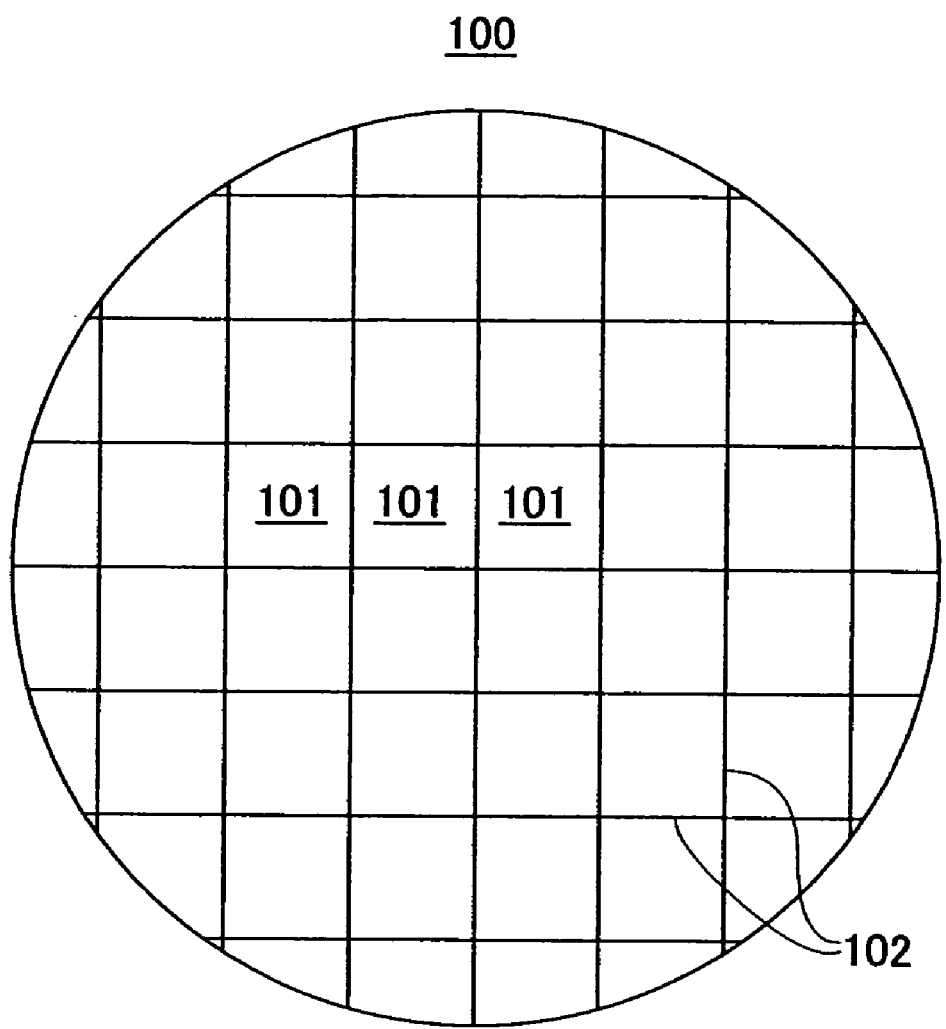
FIG. 6 is a diagram showing an example of a semiconductor wafer on which the semiconductor device of FIGS. 5A and 5B are formed.

While such alignment marks 23M, 23N, 24C, 25B, 26B, 26C may be formed in a device region 101 of a semiconductor wafer 100, it is generally practiced to provide these alignment marks in a scribe region 102 defining the individual chip regions 101 on the semiconductor wafer 100 as shown in FIG. 6. It should be noted that the present invention also includes a semiconductor wafer in which the alignment marks are formed in the scribe region.

Figure 7:
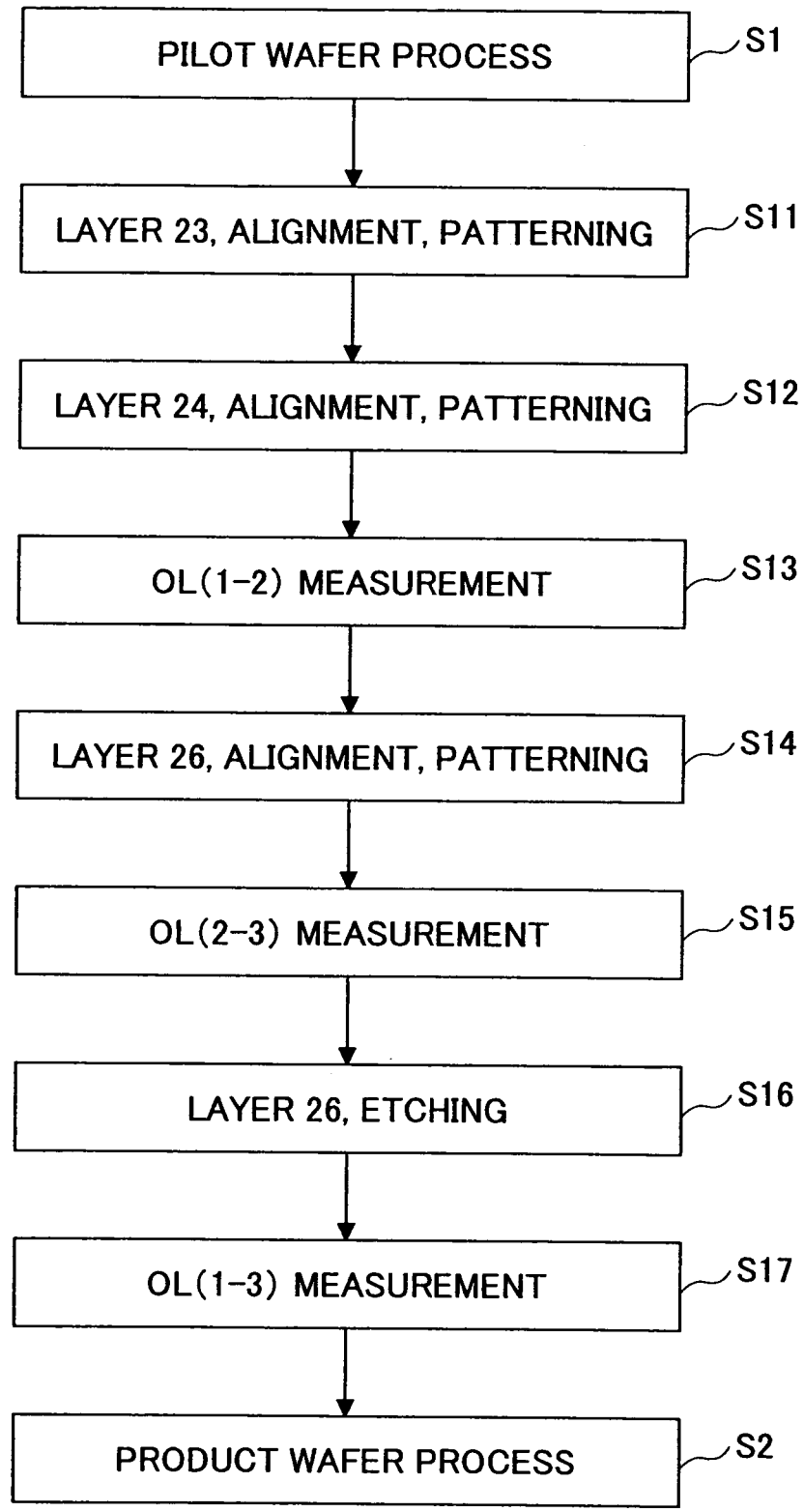
FIG. 7 is a flowchart showing the fabrication process of the semiconductor device according to an embodiment of the present invention.

FIG. 7 is a flowchart showing the alignment method according to the present invention.

Referring to FIG. 7, the processing for a pilot wafer is conducted at first in the step 1, wherein the processing of the step 1 includes the steps of: aligning the conductor pattern in the insulation film that includes the alignment marks 23M and 23N with regard to the underlying step (step 11: see FIGS. 4A and 4B); aligning the conductor pattern in the interlayer insulation film 24 with regard to the conductor pattern in the interlayer insulation film 23 by using the alignment mark 23N (step 12: see FIGS. 4A and 4B); obtaining the alignment error parameter OL(1-2) therebetween (step 13); aligning the Al film 26 with regard to the alignment mark 24C by using the depression 26a (step 14: see FIGS. 4D and 4E); obtaining the alignment error parameter OL(2-3) therebetween (step 15); actually patterning the Al film 26 (step 16); and obtaining the alignment error parameter OL(1-3) by using the isolated Al pattern 26B formed as a result of patterning of the Al film 26 and the alignment mark pattern in the interlayer insulation film 23.

Further, the alignment error correction value OL(target) is obtained based on the alignment error parameters OL(1-2), OL(2-3) and OL(1-3) thus obtained according to Equation (1). Thus, in the processing of the product wafer in the step 2, the position of the resist pattern R3 is corrected in the step of FIGS. 4D and 4E with regard to the effect of the parameters OL(1-2), OL(2-3) and OL(target) according to Equation (2).

As a result, according to the present invention, it becomes possible to obtain the structure shown in FIGS. 5A and 5B in which the conductor pattern formed by the patterning of the Al film 26 is properly alignment with regard to the alignment mark pattern 23M in the interlayer insulation film at the time of the processing of the product wafer.

Figure 8:
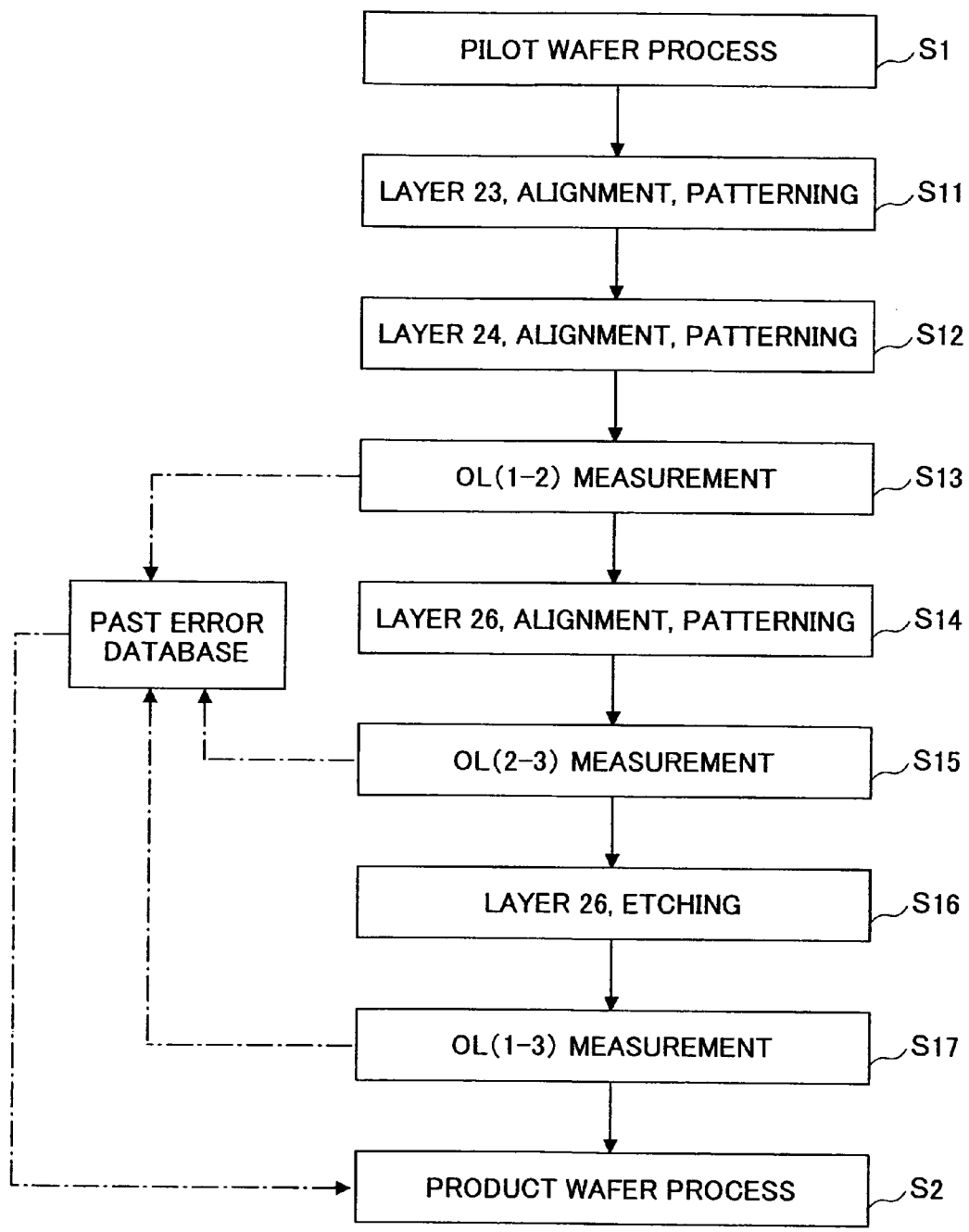
FIG. 8 is a flowchart showing a modification of the flowchart of FIG. 7.

Further, as shown in FIG. 8, it is possible to accumulate the result of pilot wafer processing in a database and emit the pilot wafer processing by reading out such a database at the time of the product wafer processing.

Further, the present invention is not limited to the embodiments described heretofore, but various variations and modifications may be made without departing from the scope of the invention.

What is claimed is:

1. A semiconductor device, comprising:
  a first insulation layer including a first conductor pattern;
  a second insulation layer formed on said first insulation layer and including a second conductor pattern; and
  a third conductor pattern formed on said second insulation layer,
  wherein there is formed a first alignment mark part in said first insulation layer by a part of said first conductor pattern,
  said third conductor pattern is formed with a second alignment mark part corresponding to the first alignment mark part,
  said second alignment mark part being formed at a position overlapping said first alignment mark part when viewed perpendicularly to said first insulation layer, said first and second alignment marks forming a mark pair for detecting alignment of said first conductor pattern and said third conductor pattern, said second conductor pattern being formed in said second insulation layer so as to avoid said first alignment mark part.

2. The semiconductor device as claimed in claim 1, wherein a part of said first conductor pattern forms a third alignment mark part, said second conductor pattern forms a fourth alignment mark part in said second insulation film corresponding to said third alignment mark part, said third and fourth alignment mark parts forming another alignment mark pair for detecting positional alignment between said first conductor pattern and said second conductor pattern.

3. The semiconductor device as claimed in claim 2, wherein said second insulation film has a depression as a fifth alignment mark part, said third conductor pattern covering a surface of said second insulation film and a sidewall surface of said depression continuously, there is formed an opening in said third conductor pattern so as to expose a bottom surface of said depression as a sixth alignment mark part corresponding to said fifth alignment mark part, said fifth alignment mark and said sixth alignment mark forming another alignment mark pair for detecting positional alignment between said second conductor pattern and said third conductor pattern.

4. The semiconductor device as claimed in claim 1, wherein said third conductor pattern comprises Al or an Al alloy.

5. The semiconductor device as claimed in claim 4, wherein said first conductor pattern comprises Cu or Al.

6. The semiconductor device as claimed in claim 5, wherein said second conductor pattern comprises W.

7. A semiconductor substrate, in which a plurality of semiconductor devices are formed in regions defined by a scribe region, each of said semiconductor devices comprising:

a first insulation layer including a first conductor pattern;

a second insulation layer formed on said first insulation layer and including a second conductor pattern; and a third conductor pattern formed on said second insulation layer, said first conductor pattern forming a first alignment mark part on said scribe region, said second alignment mark part being formed at a position overlapping said first alignment mark part when viewed perpendicularly to said first insulation layer, said third conductor pattern forming a second alignment mark part with regard to said first alignment mark part on said scribe region, said first and second alignment mark parts forming an alignment mark pair on said scribe region, said second conductor pattern being formed so as to avoid said first alignment mark part.

* * * * *